(12) United States Patent
Lou

(10) Patent No.: US 6,358,845 B1
(45) Date of Patent: Mar. 19, 2002

(54) METHOD FOR FORMING INTER METAL DIELECTRIC

(75) Inventor: Chine-Gie Lou, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/808,921

(22) Filed: Mar. 16, 2001

(51) Int. Cl.[7] .............................................. H01L 21/44
(52) U.S. Cl. ...................... 438/668; 438/624; 438/633; 438/638; 438/666
(58) Field of Search ................................ 438/624, 633, 438/638, 666, 668

(56) References Cited

U.S. PATENT DOCUMENTS

| | | | | |
|---|---|---|---|---|
| 5,728,628 A | * | 3/1998 | Havermann | 438/668 |
| 5,789,314 A | * | 8/1998 | Yen et al. | 438/668 |
| 5,872,052 A | * | 2/1999 | Iyer | 438/624 |
| 5,891,805 A | * | 4/1999 | Cheng et al. | 438/633 |
| 5,981,384 A | * | 11/1999 | Juengling | 438/666 |
| 5,990,558 A | * | 11/1999 | Tran | 257/759 |
| 6,033,981 A | | 3/2000 | Lee et al. | 438/624 |
| 6,096,654 A | | 8/2000 | Kirchhoff et al. | 438/699 |
| 6,140,221 A | | 10/2000 | Annapragada et al. | 438/622 |
| 6,194,305 B1 | * | 2/2001 | Iyer | 438/624 |
| 6,207,553 B1 | * | 3/2001 | Buynoski et al. | 438/638 |
| 6,268,277 B1 | * | 7/2001 | Bang | 438/633 |

* cited by examiner

Primary Examiner—John F. Niebling
Assistant Examiner—Lynne Gurley
(74) Attorney, Agent, or Firm—George O. Saile; Stephen B. Ackerman; Sergin Oktoy

(57) ABSTRACT

A method is disclosed for forming insulative inter metal dielectric (IMD) layers without the attendant problems of having voids, key-holes and air gaps. This is accomplished by reducing the aspect ratio of the gaps between metal lines through a judicious two-step dielectric filling process and through the use of two-step removal of the photoresist. That is, the gap is filled with photoresist first, and then partially removed, thereby leaving a portion in the gap to reduce the aspect ratio of the gap. When a second insulative layer is formed over the substrate, the gap between the metal lines is filled without the conventional attendant problem of forming voids or key-holes. Hence, void free IMD integration with improved IMD gap filling is achieved along with improved IMD thermal conductivity through the use of a metal liner.

19 Claims, 2 Drawing Sheets

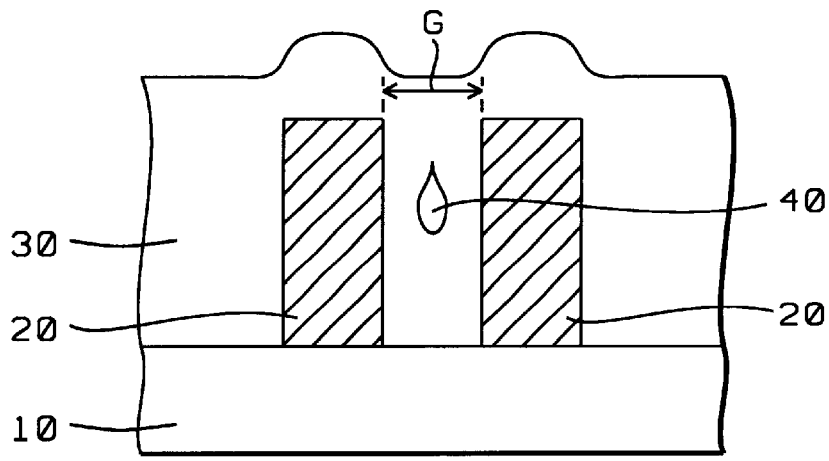
*FIG. 1a - Prior Art*
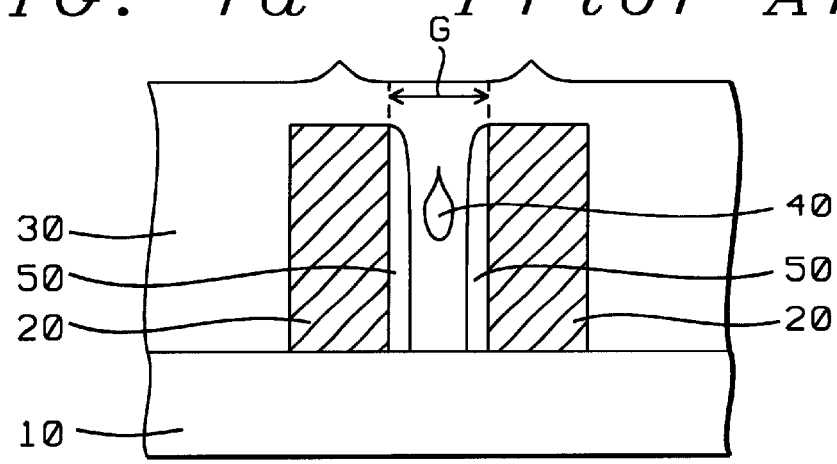
*FIG. 1b - Prior Art*
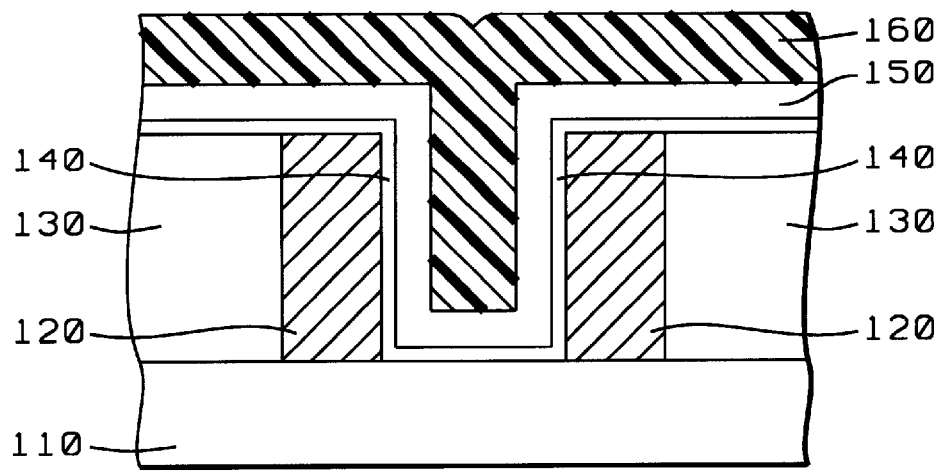
*FIG. 2a*

METHOD FOR FORMING INTER METAL DIELECTRIC

BACKGROUND OF THE INVENTION (1) Field of the Invention

The present invention relates to the manufacture of semiconductor devices in general, and in particular, to a method of forming void free inter-metal dielectrics with improved gap filling and thermal characteristics.

(2) Description of the Related Art

Inter-metal dielectrics are insulative materials that are used for insulating metal interconnect layers in semiconductor devices, as is well known in the art. As the dimensions of the metal lines are shrinking ever so fast in order to realize increased device content and higher switching speeds on integrated circuits, the spacings between the lines are also decreasing to less than 0.2 micrometers. Consequently, it is getting more and more difficult to fill the gaps between the lines with the conventional insulative dielectrics such as doped silicate glasses including borophosphosilicate glass (BPSG), tetraethyl orthosilicate (TEOS), fluorosilicate glass (FSG).

A typical example of the type of problem encountered with poor filling of a gap is shown in FIG. 1a. Here, in the cross-section of a semiconductor substrate, two conducting lines (20) are formed on substrate (10). Insulative dielectric layer (30) is formed over the substrate including gap (G) between the lines. It is found in the present manufacturing line that with gaps approaching 0.2 μm, air gaps, voids, and key-holes (40), as they are sometimes referred to in the art, are formed in between the lines, as shown in FIG. 1a. Although air gaps may aid in reducing the effective dielectric constant of the insulative layer, and hence that of the capacitive coupling between the lines to improve speed, generally they are more harmful than being helpful as they can cause reliability problems such as delaminations, shorts, and so on, as is well known in the art.

Furthermore, with closer spacings of deep submicron technologies, the aspect ratio of the height to gap spacing becomes high, sometimes more than 2, thereby making that much more difficult the filling of the gap in between the lines. It will be appreciated by those skilled in the art that the problem of high aspect ration is exacerbated even further in the presence of oxide spacers—reference numeral (50) in FIG. 1b—that are often used in the manufacture of integrated circuit chips.

A method to eliminate voids in the dielectric oxide between closely spaced conducting lines is disclosed by Lee, et al., in U.S. Pat. No. 6,033,981. A substrate is provided with narrowly spaced conductive lines. A high density plasma (HDP) dielectric layer is deposited overlying the conductive lines and the substrate. The HDP layer is etched through to expose the edges of the conducting lines. An insulating layer is deposited overlying the HDP layer and conducting lines. A chemical mechanical polishing (CMP) is used to remove the peaks of the insulating layer, exposing the HDP layer in the area overlying the conducting lines. The exposed HDP layer is etched away exposing the top surface of the conducting lines. The insulating layer is then selectively etched away. Spacers are then added along the sidewalls of the conductor. Finally, a second HDP layer is deposited overlying the first dielectric layer and conducting lines free from voids.

In another U.S. Pat. No. 6,140,221, Annapragada, et al., teach a method of forming vias through a porous insulative dielectric layer of a semiconductor device. In this method, a first via is formed in the porous dielectric layer, which in turn is filled with a less porous dielectric material. Then a second via is formed through the less porous material. The vias so formed are said to be useful for porous insulative layers that include aero gel materials.

In still another method for filling narrow gaps shown in U.S. Pat. No. 6,096,654, Kirchoff, et al., use a doped silicate glass having a dopant concentration in a bottom portion thereof which is grater than an amount which causes surface crystal growth and in an upper portion thereof having a lower dopant concentration such that the overall dopant concentration of the doped silicate glass is below that which causes surface crystal growth.

The present invention teaches a different, two-step gap filling process for forming inter-metal dielectric layer without void formation, but with improved gap filling, and additionally, with improved thermal characteristics, as described in the embodiments of the invention.

SUMMARY OF THE INVENTION

It is therefore an object of the present invention to provide a method of forming inter metal dielectric (IMD) layers in high aspect ratio gaps between metal lines without the attendant problems of having voids, key-holes.

It is another object of the present invention to provide a two-step filling process for forming IMD layers.

It is an overall object of the present invention to provide a void free IMD integration process with improved gap filling and improved thermal characteristics for a more reliable semiconductor device.

These objects are accomplished by providing a substrate; forming a metal line pattern over said substrate; forming a liner layer over said metal line pattern including over a gap between two adjacent metal lines; forming a first insulative layer conformally covering said liner layer; forming a photoresist layer over said substrate and then partial stripping said photoresist layer only to leave a portion of said photoresist in said gap so as to reduce the aspect ratio of said gap between said metal lines; removing said first insulative layer partially only to leave that portion underlying and surrounding said portion of said photoresist layer in said gap between said metal lines; removing said portion of said photoresist layer remaining in said gap; filling said gap of said reduced aspect ratio with a second insulative layer so as to avoid the problem of forming voids in otherwise deep, high aspect ratio gaps; and forming an oxide layer over said second insulative layer on said substrate, and chemical mechanical polishing said oxide layer.

BRIEF DESCRIPTION OF THE DRAWINGS

FIG. 1a is a cross-sectional view of a portion of a semiconductor substrate showing the forming of a void or key-hole in the gap between the metal lines, according to prior art.

FIG. 1b is a cross-sectional view of a portion of a semiconductor substrate showing the forming of a void or a key-hole in the gap between the metal lines having oxide spacers, according to prior art.

FIG. 2a is a cross-sectional view of a portion of a semiconductor substrate showing the forming of a metal liner, a conformal first insulative inter-metal dielectric (IMD) over the metal liner, and a photoresist layer over the substrate so as to fill the gap between the metal lines of FIG. 2a, according to the instant invention.

DESCRIPTION OF THE PREFERRED EMBODIMENTS

Figure 2B:
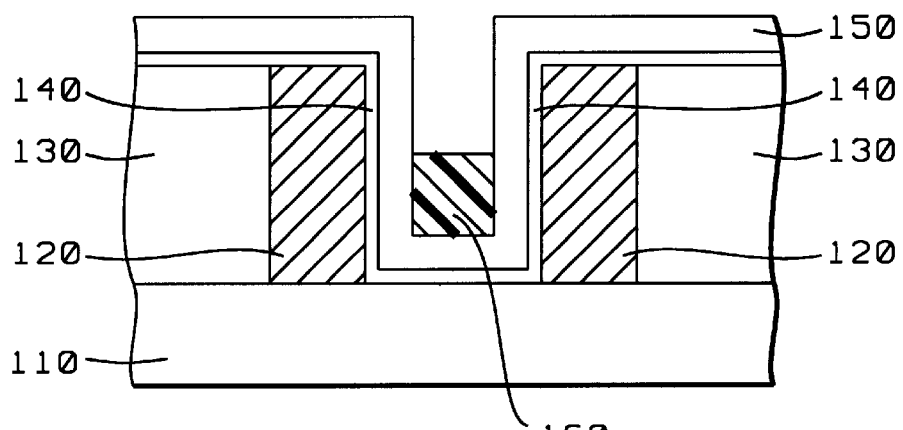
FIG. 2b is a cross-sectional view of a portion of a semiconductor substrate showing the partial stripping of the photoresist layer of FIG. 2a, according to the instant invention.

Referring now the drawings, in particular to FIGS. 2a–2d, there is shown a method of forming inter-metal dielectric (IMD) layers without the attendant problems of having voids, key-holes and air gaps. This is accomplished by reducing the aspect ratio of the gaps between metal lines through a judicious two-step dielectric filling process and through the use of a two-step removal of the photoresist. That is, the gap is filled with photoresist first, and then partially removed, thereby leaving a portion in the gap to reduce the aspect ratio of the gap. When a second insulative layer is formed over the substrate, the gap between the metal lines is filled without the conventional attendant problems of forming voids or key-holes. Hence, void free IMD integration with improved IMD gap filling is achieved along with improved IMD thermal conductivity through the use of a metal liner.

Specifically, FIG. 2a shows substrate (110), preferably silicon, having metal lines (120) formed thereon. It is understood that the substrate may contain a substructure comprising devices and various other layers including dielectric layer (130), in which metal lines (120) are formed. Inasmuch as the methods utilized in forming such semiconductor structures are well known in the art, they are not presented here in order not to obscure the main aspects of the present invention.

Metal lines (120) usually comprise aluminum (Al), copper (Cu), or alloys thereof, and they are formed in any number of ways, including electrochemical deposition. In the present submicron technology, the thickness of the metal lines is between about 2500 to 6000 Å, and the spacing, or the gap, between the lines, is about 500 to 4000 Å. Thus, the aspect ratio of the gap, that is, the ratio of the thickness of the metal line to the gap between the lines can be as high as 1.6 to 12. It is tho experience in the present manufacturing line that for high aspect ratios formation of voids and key-holes will result when forming insulative IMD layers over metal lines. It is a main feature and key aspect of the present invention to reduce such high aspect ratios prior to depositing the final IMD layers over metal layers, as described below in conjunction with the newly disclosed two-step process.

However, first, an adhesive, as well as a barrier layer, aluminum nitride (AlN) is conformally formed over the substrate as a metal liner, including the metal lines and the gap between the metal lines, as shown by reference numeral (140) in the same FIG. 2a. AlN adheres well to metal as well as to dielectric materials, and at the same time possesses good thermal characteristics such as high thermal conductivity. The preferred thickness of this metal liner is between about 100 to 300 Å, and it is formed by chemical vapor deposition, CVD.

After having formed the AlN liner, first insulative intermetal dielectric (IMD) layer (150) is formed conformally over metal liner (140). It is preferred that the IMD layer is either a fluorosilicate glass (FSG) or an $O_3$-(TEOS) tetraethylorthosilicate having a thickness between about 200 to 1500 Å. The forming of the first insulative IMD layer is the first step of the important two-step filling process of the present invention. The second step of filling the gap between the metal lines with a second IMD layer will take place after the partial removal of the first IMD layer in the following way:

Photoresist layer (160) is formed over the substrate, including over the conformal first IMD layer in the gap between the metal lines, as shown in FIG. 2a. The thickness of the photoresist layer can be between about 0.8 to 1.2 $\mu$m. Then, the photoresist is partially stripped, as seen in FIG. 2b, using conventional chemical wet etch techniques. It is preferred that the thickness of photoresist layer (160) remaining in the gap is between about 200 to 2000 Å.

Figure 2C:
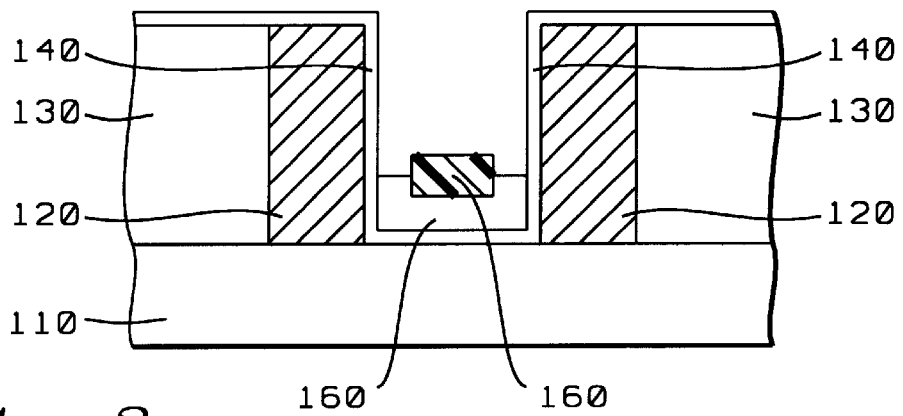
FIG. 2c is a cross-sectional view of a portion of a semiconductor substrate showing the removal of the first IMD layer of FIG. 2b, according to the present invention.

Next, the now exposed first insulative IMD layer is removed from the surface of the substrate, including from along the vertical walls of the metal lines surrounding the gap, using a chemical dry etch recipe comprising $CF_4$ and $O_2$. However, the first IMD layer surrounding the photoresist layer in the gap, and underlying it, remains, as shown in FIG. 2c. The metal liner AlN also remains and serves to enhance the thermal characteristics of the final IMD layer. The remaining photoresist in the gap is then removed, as seen in FIG. 2d.

Figure 2D:
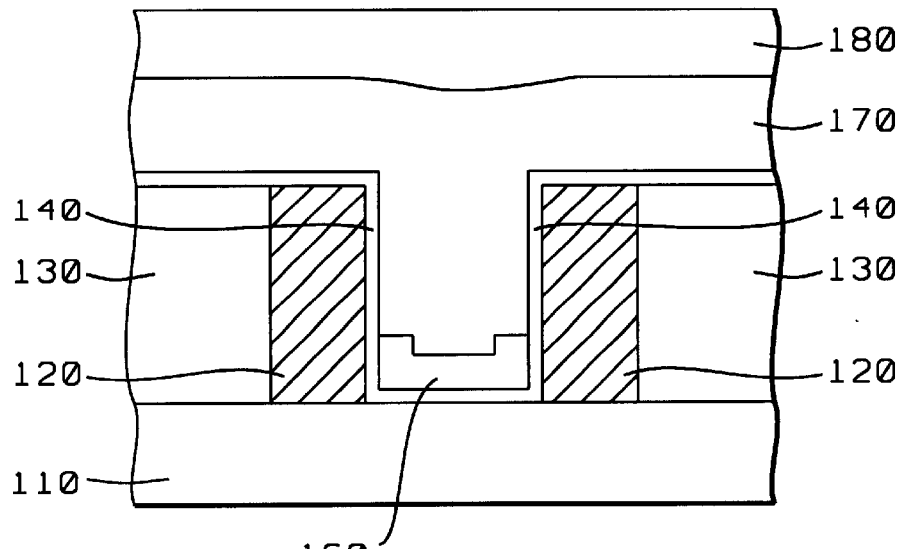
FIG. 2d is a cross-sectional view of a portion of a semiconductor substrate showing the completion of the two-step process IMD filling of the gap between the metal lines of FIG. 2a, according to the present invention.

As another key aspect of the present invention, the second step of the two-step filling process is performed at this stage by blanket forming second insulative IMD layer (170) over the substrate, including the gap, as shown in FIG. 2d. As is known in the art, blanket dielectric layers may be formed from materials including but not limited to silicon oxide materials, silicon nitride materials, and silicon oxynitrides materials formed within integrated circuits through methods including but not limited do chemical vapor deposition (CVD), plasma enhanced CVD (PECVD), or, physical vapor deposition (PVD) sputtering methods. For the preferred embodiment of the present invention, second insulative IMD layer (170) is preferably formed of either fluorosilicate glass (FSG) or $O_3$-TEOS. Preferably, the second insulative IMD layer is formed by CVD to a thickness between about 2000 to 10000 Å.

It will be appreciated by those skilled in the art that when forming the second insulative IMD layer in the gap, because of the presence of the first IMD layer already in the gap, the aspect ratio is relatively lower and hence the forming of voids or key-holes is avoided. As a final step in completing the forming of the inter-metal dielectric of the present invention, another blanket dielectric layer (180) selected from materials including but not limited to silicon oxide materials is formed over the second insulative IMD layer as shown in the same FIG. 2d. It is preferred that the thickness of this oxide layer is between about 1000 to 3000 Å. Subsequently, layer (180) is planarized by using the well known technique of chemical mechanical polishing, thus readying the substrate for another metal layer, if so required.

While the invention has been particularly shown and described with reference to the preferred embodiments thereof, it will be understood by those skilled in the art that various changes in form and details may be made without departing from the spirit and scope of the invention.

What is claimed is:

1. A method for forming inter-metal dielectric comprising the steps of:

providing a substrate;

forming a metal line pattern over said substrate;

forming a liner layer over said metal line pattern including over a gap between two adjacent metal lines;

forming a first insulative inter-metal dielectric (IMD) layer conformally over said liner layer;

forming a photoresist layer over said substrate and then partial stripping said photoresist layer only to leave a portion of said photoresist in said gap so as to reduce the aspect ratio of said gap between said metal lines;

removing said first insulative IMD partially only to leave that portion underlying and surrounding said portion of said photoresist layer in said gap between said metal lines;

removing said portion of said photoresist layer remaining in said gap;

filling said gap of said reduced aspect ratio with a second insulative IMD layer so as to avoid the problem of forming voids in otherwise deep, high aspect ratio gaps; and forming an oxide layer over said second insulative IMD layer on said substrate, and chemical mechanical polishing said oxide layer.

2. The method of claim 1, wherein said metal line comprises aluminum (Al) or copper (Cu).

3. The method of claim 1, wherein said metal line patter has a thickness between about 2500 to 6000 Å.

4. The method of claim 1, wherein said liner layer comprises aluminum nitride (AlN).

5. The method of claim 1, wherein said liner layer has a thickness between about 100 to 300 Å.

6. The method of claim 1, wherein said first insulative IMD layer comprises fluorosilicate glass (FSG) or $O_3$-TEOS having a thickness between about 200 to 1500 Å.

7. The method of claim 1, wherein said partial stripping of said photoresist layer is accomplished by wet etch.

8. The method of claim 1, wherein said removing partially said first insulative IMD layer is accomplished by chemical dry etch.

9. The method of claim 1, wherein said second insulative IMD layer comprises fluorosilicate glass (FSG) or $O_3$-TEOS having a thickness between about 2000 to 10000 Å.

10. The method of claim 1, wherein said oxide layer has a thickness between about 1000 to 3000 Å.

11. A method for forming inter-metal dielectric comprising the steps of:

providing a semiconductor substrate having a substructure comprising devices formed in said substrate and a dielectric layer formed thereon;

forming a metal line pattern over said dielectric layer;

forming a liner layer over said line pattern;

forming a first insulative IMD dielectric layer over said liner layer;

forming a photoresist layer over said first insulative IMD layer;

partial stripping said photoresist layer to leave a portion of said photoresist layer in a gap between said metal line pattern to reduce the aspect ratio of said gap between said metal lines;

partial stripping said first insulative IMD layer to leave a portion of said first insulative IMD layer underlying and surrounding said portion of said photoresist in said gap;

removing the remainder of said portion of said photoresist layer;

forming a second insulative IMD layer over said substrate, including over said metal line pattern to fill said gap of said reduced aspect ratio;

forming an oxide layer over said second insulative IMD layer; and performing chemical mechanical polishing of said oxide layer.

12. The method of claim 11, wherein said metal line comprises aluminum (Al), or copper (Cu).

13. The method of claim 11, wherein said liner layer has a thickness between about 100 to 300 Å.

14. The method of claim 11, wherein said first insulative IMD layer comprises fluorosilicate glass (FSG) or $O_3$-TEOS.

15. The method of claim 11, wherein said first insulative IMD layer has a thickness between about 200 to 1500 Å.

16. The method of claim 11, wherein said partial stripping of said photoresist layer is accomplished by wet etch.

17. The method of claim 11, wherein said partial stripping said first insulative layer is accomplished by chemical dry etch.

18. The method of claim 11, wherein said second insulative IMD layer comprises fluorosilicate glass (FSG) or $O_3$-TEOS having a thickness between about 2000 to 10000 Å.

19. The method of claim 11, wherein said oxide layer has a thickness between about 1000 to 3000 Å.

* * * * *

UNITED STATES PATENT AND TRADEMARK OFFICE
CERTIFICATE OF CORRECTION

PATENT NO.    : 6,358,845 B1                                      Page 1 of 1
DATED         : March 19, 2002
INVENTOR(S)   : Chine-Gie Lou It is certified that error appears in the above-identified patent and that said Letters Patent is hereby corrected as shown below:

<u>Title page,</u>
Item [74], delete "Sergin Oktoy" and replace with -- Sevgin Oktay --.

Signed and Sealed this

Eleventh Day of June, 2002

Attest:

Attesting Officer

JAMES E. ROGAN
*Director of the United States Patent and Trademark Office*